(12) United States Patent
Hirayama et al.

(10) Patent No.: US 7,371,510 B2
(45) Date of Patent: May 13, 2008

(54) MATERIAL FOR FORMING RESIST PROTECTING FILM FOR USE IN LIQUID IMMERSION LITHOGRAPHY PROCESS, COMPOSITE FILM, AND METHOD FOR FORMING RESIST PATTERN

(75) Inventors: Taku Hirayama, Kawasaki (JP); Ryoichi Takasu, Kawasaki (JP); Mitsuru Sato, Kawasaki (JP); Kazumasa Wakiya, Kawasaki (JP); Masaaki Yoshida, Kawasaki (JP); Koki Tamura, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 0 days.

(21) Appl. No.: 11/702,602

(22) Filed: Feb. 6, 2007

(65) Prior Publication Data

US 2007/0134593 A1    Jun. 14, 2007

Related U.S. Application Data

(62) Division of application No. 10/546,358, filed as application No. PCT/JP2004/001956 on Feb. 20, 2004, now abandoned.

(30) Foreign Application Priority Data

| Feb. 20, 2003 | (JP) | ............................. 2003-043394 |
| May 9, 2003 | (JP) | ............................. 2003-132288 |
| Jul. 10, 2003 | (JP) | ............................. 2003-195409 |
| Jul. 31, 2003 | (JP) | ............................. 2003-205001 |

(51) Int. Cl.
  *G03F 7/11* (2006.01)
  *G03F 7/20* (2006.01)
  *G03F 7/207* (2006.01)

(52) U.S. Cl. .................... 430/326; 430/273.1; 430/327; 430/396; 524/543; 524/544; 524/545; 524/546; 524/547

(58) Field of Classification Search ............. 430/273.1, 430/327, 325, 396, 326; 524/543, 544, 545, 524/546, 547
See application file for complete search history.

(56) References Cited

U.S. PATENT DOCUMENTS

| 3,895,949 | A | | 7/1975 | Akamatsu et al. |
| 5,282,066 | A | * | 1/1994 | Yu et al. ........................ 359/3 |
| 5,728,508 | A | | 3/1998 | Takemura et al. |
| 6,136,505 | A | | 10/2000 | Tanabe et al. |
| 7,129,009 | B2 | | 10/2006 | French et al. |
| 2004/0075895 | A1 | * | 4/2004 | Lin ............................. 359/380 |
| 2005/0123863 | A1 | | 6/2005 | Chang et al. |
| 2005/0175940 | A1 | | 8/2005 | Dierichs |
| 2005/0186516 | A1 | * | 8/2005 | Endo et al. .................. 430/322 |
| 2005/0202347 | A1 | | 9/2005 | Houlihan et al. |
| 2005/0250898 | A1 | * | 11/2005 | Maeda et al. ................ 524/544 |
| 2005/0266354 | A1 | * | 12/2005 | Li et al. ...................... 430/322 |
| 2006/0029884 | A1 | * | 2/2006 | Hatakeyama et al. ..... 430/270.1 |
| 2006/0105272 | A1 | * | 5/2006 | Gallagher et al. ........... 430/311 |
| 2006/0111550 | A1 | * | 5/2006 | Hata et al. ................... 528/501 |
| 2006/0234164 | A1 | * | 10/2006 | Rhodes et al. .............. 430/311 |
| 2006/0275704 | A1 | * | 12/2006 | Hinsberg, III ........... 430/273.1 |
| 2006/0275706 | A1 | * | 12/2006 | Corliss et al. .............. 430/311 |

FOREIGN PATENT DOCUMENTS

| JP | 62-65326 | 3/1987 |
| JP | 7-253674 | 10/1995 |
| JP | 8-76382 | 3/1996 |
| JP | 10-303114 | 11/1998 |
| JP | 11-352697 | 12/1999 |
| WO | 99/49504 | 9/1999 |

OTHER PUBLICATIONS

Hoffnagle, J.A. et al., "Liquid immersion deep-ultraviolet interferometric lithography", *Journal of Vacuum Science and Technology*, B 17(6), pp. 3306 to 3309 (1999).
Switkes, M. et al., "Immersion lithography at 157 nm", *Journal of Vacuum Science and Technology*, B 19(6), pp. 2353 to 2356 (2001).
Switkes, M. et al., "Resolution Enhancement of 157 nm, Lithography by Liquid Immersion" *Proceedings of SPIE*, vol. 4691, pp. 459 to 465 (2002).

* cited by examiner

*Primary Examiner*—Richard L. Schilling
(74) *Attorney, Agent, or Firm*—Wenderoth, Lind & Ponack, LLP

(57) ABSTRACT

Provided are a material for forming a resist protecting film which is for use in a liquid immersion lithography process and which is formed on a resist film, wherein the material has the following properties of: being transparent with respect to exposure light; having substantially no compatibility with a liquid for liquid immersion lithography; and causing no mixing with the resist film, a composite film comprising a protective film formed from the material and a resist film, and a method for forming a resist pattern using them. These can prevent both the resist film and the liquid used from changing in properties during the liquid immersion lithography, so that a resist pattern with high resolution can be formed using the liquid immersion lithography.

10 Claims, No Drawings

MATERIAL FOR FORMING RESIST PROTECTING FILM FOR USE IN LIQUID IMMERSION LITHOGRAPHY PROCESS, COMPOSITE FILM, AND METHOD FOR FORMING RESIST PATTERN

This is a divisional of Ser. No. 10/546,358, filed Aug. 19, 2005, now abandoned, which is a 371 of PCT/JP2004/001956, filed Feb. 20, 2004.

TECHNICAL FIELD

The present invention relates to a material for forming a resist protecting film which is advantageously used in a liquid immersion lithography process, especially in a liquid immersion lithography process of the construction in which a resist film is exposed with lithographic exposure light through a liquid present at least on the resist film in a path of the exposure light toward the resist film wherein the liquid has a predetermined thickness and has a refractive index higher than that of air and lower than that of the resist film, thus improving the resolution of a resist pattern. The present invention also relates to a resist film having thereon a protective film formed from the material for forming a protecting film, and to a method for forming a resist pattern using the protective film.

BACKGROUND ART

In the fabrication of a variety of electronic devices with microstructures, such as semiconductor devices and liquid crystal devices, a lithography method is widely used, and, as the device structures are miniaturized, resist patterns in the lithography process are desired to be miniaturized.

Currently, in a state-of-the-art lithography technique, a fine resist pattern having a line width as small as, for example, 90 nm can be formed by the lithography method, and the formation of a further finer pattern will be needed in the future.

A first point for achieving the formation of such a fine pattern that is smaller than 90 nm, is to develop an improved exposure system and a corresponding resist. The point of the development of the improved exposure system generally includes provision of a light source, such as an $F_2$ laser, an EUV (extreme ultraviolet light), an electron beam, or an X-ray, a soft X-ray, with a shorter wavelength and of a lens having an increased numerical aperture (NA).

However, the light source having a shorter wavelength has a problem in that it requires a new expensive exposure system, and the increase of NA has a problem in that since there is a trade-off between the resolution and the depth of focus, the increase in the resolution lowers the depth of focus.

Recently, as a lithography technique which can solve the problems, a liquid immersion lithography method has been reported (cf., for example, Literature 1 (J. Vac. Sci. Technol. B(1999) 17(6), p 3306-3309), Literature 2 (J. Vac. Sci. Technol. B(2001) 19(6), p 2353-2356, and Literature 3 (Proceedings of SPIE Vol. 4691 (2002), p 459-465). In this method, a resist film is exposed through a liquid refractive index medium (refractive index liquid, immersion liquid), such as pure water or a fluorocarbon inert liquid, having a predetermined thickness, with the liquid refractive index medium lying at least on the resist film between a lens and the resist film on a substrate. In this method, the space of the path of exposure light, which has conventionally been filled with an inert gas, such as air or nitrogen gas, is replaced by a liquid having a larger refractive index (n), for example, pure water, with the result that even though a light source having a wavelength for the exposure conventionally used is employed, high resolution can be achieved without lowering the depth of focus like the case where a light source having a shorter wavelength or a lens having a higher NA is used.

By employing the liquid immersion lithography, a resist pattern having a higher resolution and an excellent depth of focus can be formed at a low cost using a lens mounted on the existing exposure system, so that the liquid immersion lithography has attracted a considerable attention.

However, in the liquid immersion lithography process, the resist film is directly in contact with the refractive index liquid (immersion liquid) during the exposure, and hence the resist film is vulnerable to invasion by the liquid. Therefore, it is necessary to check whether the resist composition conventionally used can be applied as is to the liquid immersion lithography process.

The resist composition currently commonly used are established compositions that were obtained as a result of examination of a wide variety of candidate resins in respect of the transparency to the exposure light, which is the most essential property to the resist compositions. The inventors of the present invention have made experiments and studies with a view to obtaining from the currently proposed resist compositions a resist composition having properties suitable for the liquid immersion lithography as such or after slightly adjusting the formulation of the resist composition. As a result, it has been found that a promising resist composition from a practical point of view is present. On the other hand, it has been confirmed that there are a number of resist compositions which cannot achieve satisfactory resolution of pattern in the liquid immersion lithography due to a change in their properties by the liquid, but which exhibit fine and high resolution in ordinary lithography employing the exposure through a layer of air. Such resist compositions have been established by spending considerable resources on the development, and are excellent in various resist properties, such as transparency to the exposure light, development properties, and storage stability. These resist compositions include a number of compositions which are poor only in the resistance to the immersion liquid. Some examples of the compositions, which are not suitable for the liquid immersion lithography but achieve high resolution in the lithography through a layer of air, are shown in the Comparative Examples of the present invention described later.

It has also been confirmed that, even when the resist film suitable for the liquid immersion lithography is used in the liquid immersion lithography, the quality and non-defective yield are slightly poor, as compared to those obtained in the exposure through a layer of air.

The suitability for liquid immersion lithography of the conventional resist film was evaluated based on the following analysis on the liquid immersion lithography process.

Specifically, for evaluating the performance of formation of a resist pattern by the liquid immersion lithography, it is considered to be necessary and sufficient to confirm three points, i.e., (i) the performance of the optical system in the liquid immersion lithography process, (ii) the effect of the resist film on the immersion liquid, and (iii) the change of properties of the resist film due to the immersion liquid.

With respect to the performance of the optical system in (i), as is apparent from the case where for example, a photographic sensitive plate having a surface resistance to water is immersed in water and the surface of the plate is irradiated with a pattern light, there will be no problem in principle if no light transmission loss, such as reflection, occurs at the water surface and the interface between the water and the surface of the sensitive plate. The light transmission loss in this case can be easily removed by optimizing the angle of incidence of the exposure light. Thus, it is considered that any objects of the exposure, for example, a resist film, a photographic sensitive plate, and an image screen, cause no change in the performance of the optical system, so far as they are inert to the immersion liquid, namely, they are not affected by the immersion liquid, and they do not affect the immersion liquid. Therefore, a check test for this point is not required.

The effect of the resist film on the immersion liquid in (ii) specifically indicates that the component of the resist film is dissolved in the immersion liquid to change the refractive index of the liquid. Theoretically, when the refractive index of the immersion liquid changes, the optical resolution of the pattern exposure is sure to change, and experiments are unnecessary. It is enough to simply check whether the component of the resist film immersed in a liquid is dissolved in the liquid to change the formulation or refractive index of the immersion liquid, and it is unnecessary to check the resolution by actual irradiation of a pattern light and development.

Conversely, when the resist film immersed in the liquid is irradiated with a pattern light and developed to check the resolution, it is possible to know as to whether the resolution is excellent or poor. However, it is difficult to judge whether the resolution is affected by the change of properties of the immersion liquid or the change of properties of the resist material or both.

With respect to the phenomenon in which the resolution is lowered by the change of properties of the resist film due to the immersion liquid in (iii), an evaluation test such that "the resist film after the exposure is showered with the immersion liquid and then developed, and the resultant resist pattern is examined in respect of the resolution" is satisfactory. In this evaluation method, the resist film is directly showered with the liquid, and hence the conditions for immersion are very stringent. In this point, in the test in which the resist film completely immersed in the liquid is exposed, it is difficult to judge whether the resolution is changed by the change of properties of the immersion liquid, the change of properties of the resist composition due to the immersion liquid, or both.

The phenomena (ii) and (iii) above are two sides of the same coin, and can be grasped by merely checking the change of properties of the resist film due to the liquid.

Based on the results of the analysis, the suitability for liquid immersion lithography of the resist film currently proposed was evaluated by an evaluation test such that "the resist film after the exposure is showered with the immersion liquid and then developed, and the resultant resist pattern is examined in respect of the resolution". The suitability can also be evaluated by simulating the practical production process using a "two-beam interferometry exposure method" that includes using an interfered light caused by a prism as a pattern light for exposure and subjecting a sample immersed in a liquid to exposure.

As mentioned above, for producing a new resist film suitable for the liquid immersion lithography, a large investment of resources for the development is surely needed. On the other hand, it has been confirmed that resist compositions having qualities slightly lowered but having properties suitable for the liquid immersion lithography are obtained from the currently proposed resist compositions by using the resin compositions as such or by adjusting the formulation of the resin compositions. It has also been confirmed that there are a number of resist films which cannot achieve satisfactory resolution of pattern in the liquid immersion lithography due to the change of properties by the immersion liquid, but which exhibit fine and high resolution in ordinary lithography employing the exposure through a layer of air.

DISCLOSURE OF THE INVENTION

The present invention has been achieved in view of the above problems accompanying the conventional technique, and an object of the invention is to provide a technique for applying a resist film obtained from the conventional resist composition established by spending considerable resources on the development to the liquid immersion lithography. Specifically, an object the invention is to provide a specific protective film temporarily formed on the surface of a conventional resist film, thus making it possible not only to prevent both the resist film and the liquid used from changing in properties during the liquid immersion lithography but also to form a resist pattern with high resolution using the liquid immersion lithography.

For solving the above problems, the material for forming a resist protecting film for use in a liquid immersion lithography process of the present invention is a material for forming a resist protecting film which is for use in a liquid immersion lithography process and which is formed on a resist film, wherein the material has the following properties of: being transparent with respect to exposure light; having substantially no compatibility with a liquid for liquid immersion lithography; and causing no mixing with the resist film.

The composite film for use in a liquid immersion lithography process of the present invention comprises a protective film and a resist film, wherein the protective film has the following properties of: being transparent with respect to exposure light; having substantially no compatibility with a liquid for liquid immersion lithography; and causing no mixing with the resist film, and wherein the protective film is formed on the surface of the resist film.

The method for forming a resist pattern of the present invention is a method for forming a resist pattern using a liquid immersion lithography process, wherein the method comprises: forming a photoresist film on a substrate; forming, on the resist film, a protective film having the following properties of: being transparent with respect to exposure light, having substantially no compatibility with a liquid for liquid immersion lithography, and causing no mixing with the resist film; directly placing the liquid for liquid immersion lithography having a predetermined thickness at least on the protective film on the substrate having the resist film and the protective film stacked thereon; irradiating the resist film with predetermined pattern light through the liquid for liquid immersion lithography and the protective film, and optionally subjecting the resultant resist film to heat treatment; removing the protective film from the resist film irradiated; and developing the resist film from which the protective film is removed to obtain a resist pattern.

Among the above-mentioned constructions, the liquid immersion lithography process preferably is of the construction in which the resist film is exposed with lithographic exposure light through a liquid for liquid immersion lithography present at least on the resist film in a path of the exposure light toward the resist film, wherein the liquid has a predetermined thickness and has a refractive index larger than that of air and smaller than that of the resist film, thus improving the resolution of a resist pattern.

EMBODIMENTS OF THE INVENTION

In the present invention having the above construction, the liquid for liquid immersion lithography that can be preferably used includes water substantially comprised of pure water or deionized water, or a fluorocarbon inert liquid, more preferably water from the viewpoint of cost reduction and ease of the post-treatment.

The resist films that can be used in the present invention include any resist films obtained using a conventional resist composition, and are not limited particularly. This is the most unique feature of the present invention.

The protective film according to the present invention has essential properties as described above, that the film is transparent to the exposure light and substantially incompatible with the refractive index liquid and causes no mixing with the resist film, and the protective film has excellent adhesion to the resist film and is easily removable from the resist film. A protective film material which can be used to form a protective film having such properties includes a composition obtained by dissolving a fluororesin in a fluorocarbon solvent is used.

Examples of the fluororesin that can be used include linear perfluoroalkyl polyethers, cyclic perfluoroalkyl polyethers, polychlorotrifluoroethylenes, polytetrafluoroethylenes, tetrafluoroethylene-perfluoroalkoxyethylene copolymers, and tetrafluoroethylene-hexafluoropropylene copolymers.

In practice, among commercially available fluororesins, DEMNUM S-20, DEMNUM S-65, DEMNUM S-100, and DEMNUM S-200 which are linear perfluoroalkyl polyethers (each manufactured by DAIKIN INDUSTRIES, LTD.), CYTOP series which are cyclic perfluoroalkyl polyethers (manufactured by ASAHI GLASS CO., LTD.), and TEFLON(R)-AF1600 and TEFLON (R)-AF2400 (each manufactured by DuPont) can be used.

Among the fluororesins, mixed resins comprised of linear perfluoroalkyl polyethers and cyclic perfluoroalkyl polyethers are preferred.

The fluorocarbon solvent is not particularly limited as long as it can dissolve the fluororesin. Examples of the fluorocarbon solvent that can be used include perfluoroalkanes or perfluorocycloalkanes, such as perfluorohexane and perfluoroheptane, perfluoroalkenes having a double bond remaining in the corresponding perfluoroalkanes or perfluorocycloalkanes, perfluoro cyclic ethers, such as perfluorotetrahydrofuran and perfluoro(2-butyltetrahydrofuran), perfluorotributylamine, perfluorotetrapentylamine, and perfluorotetrahexylamine.

Other organic solvents compatible with the fluorine solvent, surfactants and so on can be appropriately used in admixture.

The concentration of the fluororesin is not particularly limited as long as a film can be formed therefrom. However, from the viewpoint of achieving excellent coating properties, it is preferred that the fluororesin concentration be about 0.1 to about 30 wt %.

A preferred material for the protective film comprises a mixed resin comprised of a linear perfluoroalkyl polyether and a cyclic perfluoroalkyl polyether dissolved in perfluorotributylamine.

As mentioned above, the resist film materials that can be used in the liquid immersion lithography process of the present invention include commonly used positive resists or negative photoresists. Specific examples of positive or negative photoresists are shown below.

Resin components that can be used in the positive photoresist include an acrylic resin, a cycloolefin resin, or a silsesquioxane resin.

Preferred examples of the acrylic resin include a resin having, for example, constitutional units (a1) derived from a (meth)acrylic ester having an acid-dissociative, dissolution inhibiting group and comprising 80 mol % or more, preferably 90 mol % (most preferably 100 mol %) of constitutional units derived from a (meth)acrylic ester including constitutional units derived from another (meth)acrylic ester other than the constitutional units (a1).

For achieving excellent resolution and excellent resistance to dry etching as well as fine pattern form, the resin component comprises units (a1) and a combination of a plurality of monomer units having different functions other than the units (a1), for example, the following constitutional units.

Specifically, there can be mentioned constitutional units derived from a (meth)acrylic ester having a lactone unit (hereinafter, "(a2)" or "units (a2)"), constitutional units derived from a (meth)acrylic ester having an alcoholic hydroxyl group-containing polycyclic group (hereinafter, "(a3)" or "units (a3)"), and constitutional units having a polycyclic group different from the acid-dissociative, dissolution inhibiting group in the units (a1), the lactone unit in the units (a2), and the alcoholic hydroxyl group-containing polycyclic group in the units (a3) (hereinafter, "(a4)" or "units (a4)").

(a2), (a3), and/or (a4) can be appropriately combined depending on, for example, the properties required. Preferably, when the resin component comprises (a1) and at least one type of units selected from (a2), (a3), and (a4), excellent resolution and excellent resist pattern form can be achieved. With respect to each of the units (a1) to (a4), a plurality of different units may be used in combination.

The constitutional units derived from a methacrylic ester and the constitutional units derived from an acrylic ester are advantageously used in such a manner that there are 10 to 85 mol %, preferably 20 to 80 mol % of the constitutional units derived from the methacrylic ester and 15 to 90 mol %, preferably 20 to 80 mol % of the constitutional units derived from the acrylic ester based on the total mole of the constitutional units derived from the methacrylic ester and the constitutional units derived from the acrylic ester.

Next, the units (a1) to (a4) are described in detail.

The units (a1) are constitutional units derived from a (meth)acrylic ester having an acid-dissociative, dissolution inhibiting group. The acid-dissociative, dissolution inhibiting group in (a1) is not particularly limited as long as the group has alkali-dissolution inhibiting properties such that it makes the entire resin component alkali-insoluble before the exposure and the group dissociates due to the action of acid generated after the exposure to change the entire resin component to be alkali-soluble. Generally, groups that form cyclic or chain tertiary alkyl esters with the carboxyl group of (meth)acrylic acid, tertiary alkoxycarbonyl groups, and chain alkoxyalkyl groups are widely known.

Examples of the acid-dissociative, dissolution inhibiting group in (a1) that can be preferably used include acid-dissociative, dissolution inhibiting groups containing aliphatic polycyclic groups.

Examples of the polycyclic groups include groups obtained by eliminating one hydrogen element from a bicycloalkane, a tricycloalkane, or a teroracycloalkane, which may be unsubstituted or substituted with a fluorine atom or a fluoroalkyl group. Specific examples thereof include groups obtained by eliminating one hydrogen atom from a polycycloalkane, such as adamantane, norbornane, isobornane, tricyclodecane, or tetracyclododecane. Such a polycyclic group can be appropriately selected from a number of polycyclic groups proposed for ArF resists. Among these, preferred are an adamantyl group, a norbornyl group, and a tetracyclododecanyl group from an industrial point of view.

Monomer units represented by the general formulae (1) to (7) below are preferred as (a1) above. In the general formulae (1) to (7), R represents a hydrogen atom or a methyl group, $R_1$ represents a lower alkyl group, each of $R_2$ and $R_3$ independently represents a lower alkyl group, $R_4$ represents a tertiary alkyl group, $R_5$ represents a methyl group, $R_6$ represents a lower alkyl group, and $R_7$ represents a lower alkyl group.

Each of $R_1$ to $R_3$, $R_6$, and $R_7$ is preferably a linear or branched lower alkyl group having 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. From an industrial point of view, preferred is a methyl group or an ethyl group.

$R_4$ is a tertiary alkyl group, such as a tert-butyl group or a tert-amyl group, and preferred is a tert-butyl group from an industrial point of view.

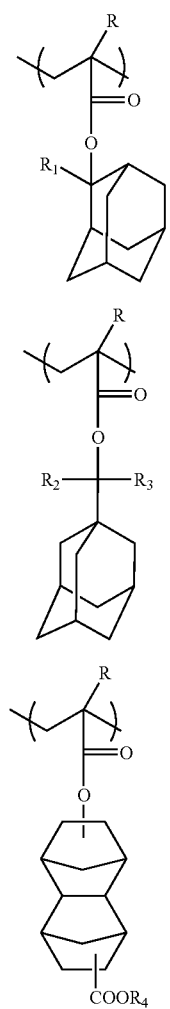

(1)

(2)

(3)

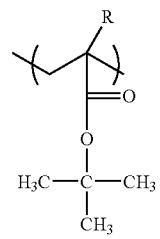

(4)

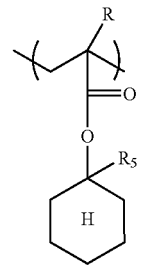

(5)

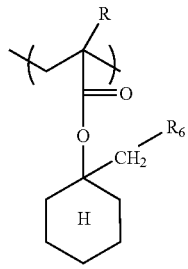

(6)

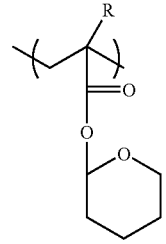

(7)

Among the above examples of units (a1), especially, constitutional units represented by the general formula (1), (2), or (3) are more preferred since a pattern having high transparency and high resolution as well as excellent resistence to dry etching can be formed therefrom.

The units (a2) above have a lactone unit, and hence are effective in enhancing the hydrophilicity with a developer solution.

The units (a2) may be any units that have a lactone unit and are copolymerizable with the other constitutional units in the resin component.

Examples of monocyclic lactone units include groups obtained by eliminating one hydrogen atom from γ-butyrolactone. Examples of polycyclic lactone units include groups obtained by eliminating one hydrogen atom from a lactone-containing polycycloalkane.

Monomer units represented by the general formulae (10) to (12) below are preferred as (a2). In the general formulae, R represents a hydrogen atom or a methyl group.

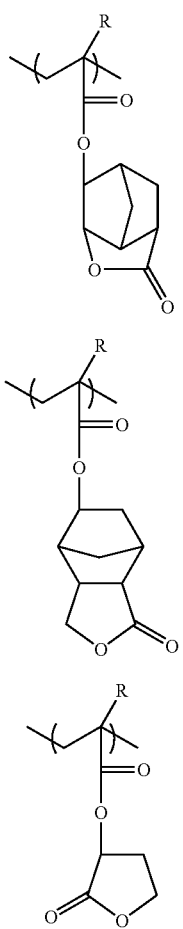

(10)

(11)

(12)

A (meth) acrylic acid γ-butyrolactone ester having an ester linkage at the α-carbon represented by the general formula (12) above and a (meth)acrylic acid norbornane lactone ester represented by the general formula (10) or (11) above are especially preferred since they are easily commercially available.

The units (a3) above are constitutional units derived from a (meth)acrylic ester having an alcoholic hydroxyl group-containing polycyclic group.

The hydroxyl group in the alcoholic hydroxyl group-containing polycyclic group is a polar group, and therefore the use of this increases the collective hydrophilicity of the resin component with a developer solution to improve the exposed portion in alkali-solubility. Thus, the resin component having (a3) preferably improves the resolution.

The polycyclic group in (a3) can be appropriately selected from the aliphatic polycyclic groups described above as examples in connection with (a1).

The alcoholic hydroxyl group-containing polycyclic group in (a3) is not particularly limited. For example, a hydroxyl group-containing adamantyl group is preferably used.

The hydroxyl group-containing adamantyl group represented by the general formula (13) below is preferred since it has an effect of improving the resistance to dry etching and squareness of the pattern cross-sectional form. In the general formula, l is an integer of 1 to 3.

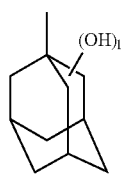

(13)

The units (a3) may be any units that have the above-described alcoholic hydroxyl group-containing polycyclic group and being copolymerizable with the other constitutional units in the resin component.

Specifically, constitutional units represented by the general formula (14) below are preferred. In the general formula (14), R represents a hydrogen atom or a methyl group.

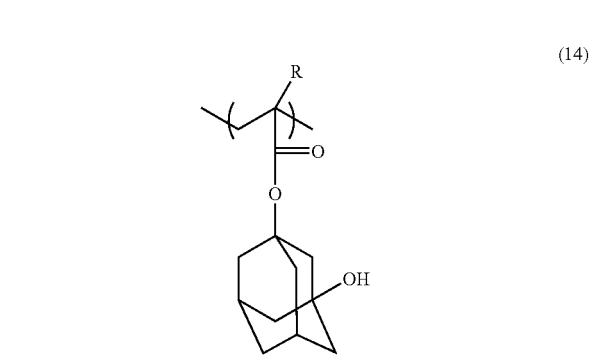

(14)

In the units (a4), the polycyclic group "different from the acid-dissociative, dissolution inhibiting group, the lactone unit, and the alcoholic hydroxyl group-containing polycyclic group" means that the polycyclic group in units (a4) in the resin component overlaps neither the acid-dissociative, dissolution inhibiting group in units (a1), the lactone unit in units (a2), nor the alcoholic hydroxyl group-containing polycyclic group in units (a3), that is, units (a4) have neither the acid-dissociative, dissolution inhibiting group in units (a1), the lactone unit in units (a2), nor the alcoholic hydroxyl group-containing polycyclic group in units (a3) that constitute the resin component.

The polycyclic group in the units (a4) is not particularly limited as long as it is selected so as not to overlap the constitutional units used as the units (a1) to (a3) in the same resin component. For example, as the polycyclic group in units (a4), the aliphatic polycyclic group as exemplified in connection with the units (a1) can be used, and a number of groups conventionally known in the ArF positive resist materials can be used.

Especially preferred is at least one member selected from the tricyclodecanyl group, adamantyl group, and tetracyclododecanyl group from the viewpoint of easy industrial availability.

The units (a4) may be any units that have the above-described polycyclic group and are copolymerizable with the other constitutional units in the resin component.

Preferred examples of (a4) are represented by the general formulae (15) to (17) below. In the general formulae, R represents a hydrogen atom or a methyl group.

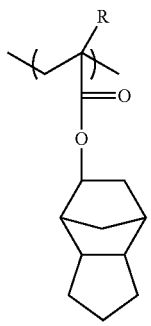

(15)

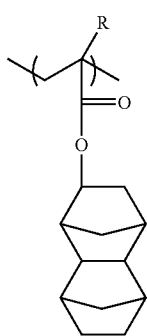

(16)

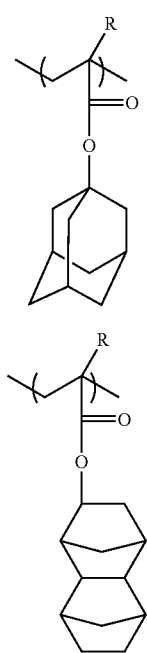

(17)

With respect to the composition of the acrylic resin component, the amount of units (a1) may be 20 to 60 mol %, preferably 30 to 50 mol %, based on the total mole of the constitutional units constituting the resin component, since excellent resolution can be achieved.

The amount of units (a2) may be 20 to 60 mol %, preferably 30 to 50 mol %, based on the total mole of the constitutional units constituting the resin component, since excellent resolution can be achieved.

When the units (a3) are used, the amount of the units (a3) may be 5 to 50 mol %, preferably 10 to 40 mol %, based on the total mole of the constitutional units constituting the resin component, since excellent resist pattern form can be achieved.

When the units (a4) are used, the amount of the units (a4) may be 1 to 30 mol %, preferably 5 to 20 mol %, based on the total mole of the constitutional units constituting the resin component, since the separate pattern or semi-dense pattern is excellent in resolution.

The units (a1) and at least one type of units selected from the units (a2), (a3), and (a4) can be appropriately used in combination depending on the purpose. However, a ternary polymer comprising units (a1) and units (a2) and (a3) is preferred since the resist pattern form, the exposure margin, the heat resistance, and the resolution are excellent. In this case, with respect to the respective contents of the constitutional units (a1) to (a3), it is preferred that the content of (a1) is 20 to 60 mol %, the content of (a2) is 20 to 60 mol %, and the content of (a3) is 5 to 50 mol %.

A mass average molecular weight (as measured using polystyrene for molecular weight calibration; this applies to the following description) of the resin in the resin component in the present invention is not particularly limited and it is preferably 5,000 to 30,000, more preferably 8,000 to 20,000. When the mass average molecular weight is larger than the upper limit of the range, the solubility in a resist solvent may become poor, and, when it is smaller than the lower limit of the range, the resistance to dry etching or the resist pattern cross-sectional form may become poor.

The cycloolefin resin is preferably a resin comprising constitutional units (a5) represented by the general formula (18) below, which are optionally copolymerized with one or more of the constitutional units obtained from (a1):

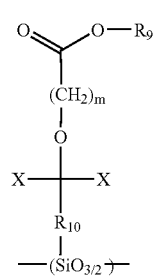

(18)

wherein $R_8$ represents a substituent mentioned above as an example of the acid-dissociative, dissolution inhibiting group in the units (a1), and m is an integer of 0 to 3.

In the units (a5), when m is 0, copolymers having units (a1) are preferably used.

Examples of the silsesquioxane resins include resins having constitutional units (a6) represented by the following general formula (19), and resins having constitutional units (a7) represented by the following general formula (20):

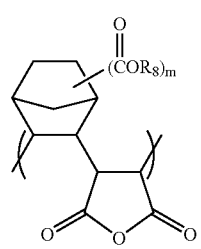

(19)

wherein $R_9$ represents an acid-dissociative, dissolution inhibiting group comprised of a hydrocarbon group containing an aliphatic monocyclic or polycyclic group, $R_{10}$ represents a linear, branched, or cyclic saturated aliphatic hydrocarbon group, X represents an alkyl group having 1 to 8 carbon atoms and having at least one hydrogen atom replaced by a fluorine atom, and m is an integer of 1 to 3;

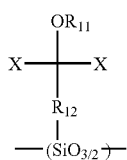

(20)

wherein $R_{11}$ represents a hydrogen atom or a linear, branched, or cyclic alkyl group, $R_{12}$ represents a linear, branched, or cyclic saturated aliphatic hydrocarbon group, and X represents an alkyl group having 1 to 8 carbon atoms and having at least one hydrogen atom replaced by a fluorine atom.

In (a6) and (a7), the acid-dissociative, dissolution inhibiting group of $R_9$ is a group which has alkali-dissolution inhibiting properties such that it makes the entire silsesquioxane resin alkali-insoluble before the exposure, and which dissociates due to the action of an acid generated from the acid generator after the exposure to change the entire silsesquioxane resin to be alkali-soluble.

Examples of such acid-dissociative, dissolution inhibiting groups include acid-dissociative, dissolution inhibiting groups represented by the general formulae (21) to (25) below include hydrocarbon groups containing a bulky aliphatic monocyclic or polycyclic group. By using the acid-dissociative, dissolution inhibiting group, the dissolution inhibiting group after dissociation is unlikely to undergo gasification, thus preventing a degasification phenomenon.

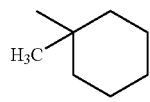

(21)

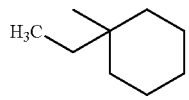

(22)

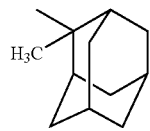

(23)

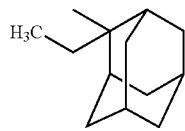

(24)

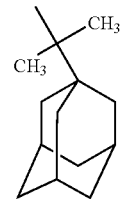

(25)

$R_9$ has preferably 7 to 15, more preferably 9 to 13 carbon atoms since the dissolution inhibiting group after dissociation is unlikely to undergo gasification and appropriate solubility in a resist solvent or in a developer solution can be obtained.

The acid-dissociative, dissolution inhibiting group can be appropriately selected from a number of groups proposed for the resins for use in, for example, ArF excimer laser resist compositions depending on the light source used as long as it is an acid-dissociative, dissolution inhibiting group comprised of a hydrocarbon group containing an aliphatic monocyclic or polycyclic group. Generally, those groups that form cyclic tertiary alkyl esters with a carboxyl group of (meth) acrylic acid are widely known.

It is especially preferred that the acid-dissociative, dissolution inhibiting group contains an aliphatic polycyclic group. The aliphatic polycyclic group can be appropriately selected from a number of aliphatic polycyclic groups proposed for the ArF resist. Examples of the aliphatic polycyclic groups include those groups obtained by eliminating one hydrogen atom from a bicycloalkane, a tricycloalkane, or a tetracycloalkane, and more specifically, those groups obtained by eliminating one hydrogen atom from a polycycloalkane such as adamantane, norbornane, isobornane, tricyclodecane, or tetracyclododecane.

Among the above general formulae, those silsesquioxane resins having any one of the 2-methyl-2-adamantyl group represented by the general formula (23) and the 2-ethyl-2-adamantyl group represented by the general formula (24) or both are preferred since they are unlikely to cause degasification and have excellent resist properties including resolution and heat resistance.

Each of $R_{10}$ and $R_{11}$ has preferably 1 to 20, more preferably 5 to 12 carbon atoms from the viewpoint of controlling the solubility in resist solvents and the molecular size. Particularly, a saturated cyclic aliphatic hydrocarbon group preferably has advantages in that the resultant silsesquioxane resin has high transparency to high-energy light, and has a high glass transition temperature (Tg), which makes easy controlling the acid generation from an acid generator during the PEB (post-exposure bake).

The saturated cyclic aliphatic hydrocarbon group may be either a monocyclic group or a polycyclic group. Examples of the polycyclic groups include those groups obtained by eliminating two hydrogen atoms from a bicycloalkane, a tricycloalkane, or a teroracycloalkane, more specifically, those groups obtained by eliminating two hydrogen atoms from a polycycloalkane such as adamantane, norbornane, isobornane, tricyclodecane, or tetracyclododecane.

More specific examples of $R_{10}$ and $R_{12}$ include those groups obtained by eliminating two hydrogen atoms from respective alicyclic compounds represented by the general formulae (26) to (31) below or derivatives thereof.

(26)

(27)

(28)

(29)

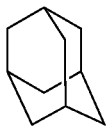

(30)

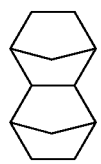

(31)

The derivatives mean the alicyclic compounds of the chemical formulae (26) to (31) above having at least one hydrogen atom replaced by a group, e.g., a lower alkyl group, such as a methyl group or an ethyl group; an oxygen atom; or a halogen atom, such as fluorine, chlorine, or bromine. Among these, preferred is a group obtained by eliminating two hydrogen atoms from an alicyclic compound selected from the group consisting of the chemical formulae (26) to (31) since high transparency is obtained and it is easily industrially available.

$R_{11}$ is a lower alkyl group having preferably 1 to 10, more preferably 1 to 4 from the viewpoint of obtaining appropriate solubility in resist solvents. More specific examples of alkyl groups include a methyl group, an ethyl group, a propyl group, an isopropyl group, an n-butyl group, a sec-butyl group, a tert-butyl group, a cyclopentyl group, a cyclohexyl group, a 2-ethylhexyl group, and an n-octyl group.

$R_{11}$ can be appropriately selected from the above candidate examples depending on the desired alkali-solubility of the silsesquioxane resin. When $R_{11}$ is a hydrogen atom, the alkali-solubility of the silsesquioxane resin is highest. When the alkali-solubility is higher, there can be obtained an advantage in that the sensitivity is improved.

On the other hand, the larger the number of carbon atoms of the alkyl group, or the more bulky the alkyl group, the lower the alkali-solubility of the silsesquioxane resin. When the alkali-solubility is lowered, the resistance to an alkaline developer solution is enhanced, and therefore the exposure margin in forming a resist pattern using the silsesquioxane resin is improved and thus the size change caused during the exposure is reduced. In addition, uneven development is prevented, suppressing roughness of the resultant resist pattern at the edge portion.

In the general formulae (19) and (20) above, X is especially preferably a linear alkyl group. The alkyl group may be a lower alkyl group having 1 to 8, preferably 1 to 4 carbon atoms from the viewpoint of obtaining the silsesquioxane resin having appropriate glass transition (Tg) temperature or solubility in a resist solvent. The alkyl group preferably has more hydrogen atoms replaced by fluorine atoms since the transparency to high-energy light or electron beam of 200 nm or shorter is improved, and the alkyl group is most preferably a perfluoroalkyl group having its all hydrogen atoms replaced by fluorine atoms. X's may be the same or different. In the general formula (19), m may be an integer of to 1 to 3, preferably 1 for permitting the acid-dissociative, dissolution inhibiting group to easily dissociate.

More specific examples of the silsesquioxane resins include those resins represented by the following general formula (32) or (33):

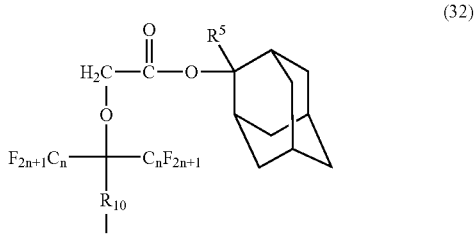

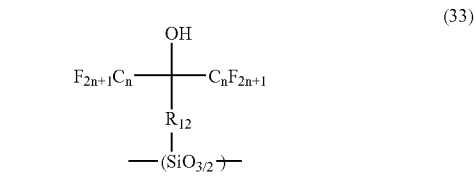

wherein $R_5$, $R_{10}$, $R_{12}$, and n are as defined above.

The amount of the constitutional units represented by (a6) and (a7) may be 30 to 100 mol %, preferably 70 to 100%, more preferably 100 mol %, based on the total mole of the constitutional units constituting the silsesquioxane resin in the present invention.

The amount of the constitutional units represented by (a6) is preferably 5 to 70 mol %, more preferably 10 to 40 mol %, based on the total mole of the constitutional units represented by (a6) and (a7). The amount of the constitutional units represented by (a7) is preferably 30 to 95 mol %, more preferably 60 to 90 mol %, based on the total mole of the constitutional units represented by (a6) and (a7).

When the amount of the constitutional units represented by (a6) falls in the above range, the amount of the acid-dissociative, dissolution inhibiting group is naturally determined, so that the silsesquioxane resin as a base resin of the positive resist composition advantageously changes in alkali-solubility before and after the exposure.

The silsesquioxane resin may have constitutional units other than the constitutional units represented by (a6) and (a7) in such an amount that the effect aimed at by the present invention is not sacrificed. Examples thereof include those units used in a silsesquioxane resin for ArF excimer laser resist compositions, e.g., alkylsilsesquioxane units represented by the general formula (34) below, having an alkyl group (R'), such as a methyl group, an ethyl group, a propyl group, or a butyl group.

The mass average molecular weight (Mw) (as measured by gel permeation chromatography using polystyrene for molecular weight calibration) of the silsesquioxane resin is not particularly limited, and it is preferably 2,000 to 15,000, more preferably 3,000 to 8,000. When the mass average molecular weight is larger than the upper limit of the range, the solubility in a resist solvent may become poor, and, when it is smaller than the lower limit of the range, the resist pattern cross-sectional form may become poor.

The mass average molecular weight (Mw)/number average molecular weight (Mn), i.e., polymer distribution is not particularly limited, and it is preferably 1.0 to 6.0, more preferably 1.5 to 2.5. When it is larger than the upper limit of the range, the resolution and the pattern form may become poor.

The silsesquioxane resin in the present invention is a polymer having in its basic skeleton a silsesquioxane comprising the constitutional units represented by (a6) and (a7), and hence has high transparency to high-energy light or electron beam of 200 nm or shorter. Therefore, the positive resist composition containing the silsesquioxane resin in the present invention is advantageously used in lithography using a light source at a wavelength shorter than that of, e.g., an ArF excimer laser, and, particularly in a single-layer process, the resist composition can form a fine resist pattern having a line width as small as 150 nm or less, and further 120 nm or less. When using a two-layer resist laminate as an upper layer, the resist composition is advantageously used in a process forming a fine resist pattern as small as 120 nm or less, and further 100 nm or less.

The resin component used in the negative resist composition is not particularly limited as long as it is a resin component commonly used. Specific preferred examples thereof are as follows.

As the resin component, there is preferably used a resin (a8) constituting a resin component that becomes alkali-insoluble due to acid, and having in its molecule two types of functional groups which can react with each other to form an ester, and which undergo dehydration due to the action of the acid generated from an acid generator added to the resist material together with the resin to form an ester, thus making the resin component alkali-insoluble. The two types of functional groups which can react with each other to form an ester mean, for example, a hydroxyl group and a carboxyl group or a carboxylic acid ester for forming a carboxylic acid ester. In other words, they mean two types of functional groups for forming an ester. Preferred examples of such resins include those resins having a hydroxyalkyl group and at least one of a carboxyl group and a carboxylic acid ester group at the side chain of the main skeleton of the resin.

Further, the resin component is preferably a resin component (a9) comprised of a polymer having dicarboxylic acid monoester units.

In other words, (a8) is a resin component having at least constitutional units represented by the following general formula (35):

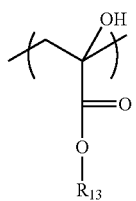

(35)

wherein $R_{13}$ represents a hydrogen atom, a $C_1$-$C_6$ alkyl group, or an alkyl group having a polycyclic ring skeleton, such as a bornyl group, an adamantyl group, a tetracyclododecyl group, or a tricyclodecyl group.

Preferred examples of such resins include polymers (homopolymers or copolymers) (a8-1) comprised of at least one type of monomers selected from an α-(hydroxyalkyl)acrylic acid and an alkyl α-(hydroxyalkyl)acrylate, and copolymers (a8-2) comprised of at least one type of monomers selected from an α-(hydroxyalkyl)acrylic acid and an alkyl α-(hydroxyalkyl)acrylate and at least one type of monomers selected from another ethylenically unsaturated carboxylic acid and an ester of another ethylenically unsaturated carboxylic acid.

The polymers (a8-1) preferably include copolymers of an α-(hydroxyalkyl)acrylic acid and an alkyl α-(hydroxyalkyl)acrylate, and, the copolymer (a8-2) preferably include copolymers that contain, as the another ethylenically unsaturated carboxylic acid or ester of another ethylenically unsaturated carboxylic acid, at least one member selected from acrylic acid, methacrylic acid, an alkyl acrylate, and an alkyl methacrylate.

Examples of the hydroxyalkyl groups in the α-(hydroxyalkyl)acrylic acid or alkyl α-(hydroxyalkyl)acrylate include lower hydroxyalkyl groups, such as a hydroxymethyl group, a hydroxyethyl group, a hydroxypropyl group, and a hydroxybutyl group. Among these, preferred is a hydroxyethyl group or a hydroxymethyl group since it readily forms an ester.

Examples of the alkyl groups in the alkyl ester portion of the alkyl α-(hydroxyalkyl)acrylate include lower alkyl groups, such as a methyl group, an ethyl group, a propyl group, an isopropyl group, an n-butyl group, a sec-butyl group, a tert-butyl group, and an amyl group; and bridged polycyclic ring hydrocarbon groups, such as a bicyclo[2.2.1]heptyl group, a bornyl group, an adamantyl group, a tetracyclo[4.4.0.1$^{2.5}$.1$^{7.10}$]dodecyl group, and a tricyclo[5.2.1.0$^{2.6}$]decyl group. When the alkyl group in the ester portion is a polycyclic ring hydrocarbon group, the resultant polymer is effective in enhancing the resistance to dry etching. Among these alkyl groups, especially preferred are lower alkyl groups, such as a methyl group, an ethyl group, a propyl group, and a butyl group, since an inexpensive and easily available alcohol component for forming an ester can be used.

Like a carboxyl group, a lower alkyl ester undergoes esterification with a hydroxyalkyl group, but an ester of a bridged polycyclic ring hydrocarbon is unlikely to undergo such esterification. Therefore, when the ester of a bridged polycyclic ring hydrocarbon is introduced into the resin, it is preferred that a carboxyl group be also present in the side chain of the resin.

On the other hand, examples of another ethylenically unsaturated carboxylic acids and esters of the ethylenically unsaturated carboxylic acid in (a8-2) include unsaturated carboxylic acids, such as acrylic acid, methacrylic acid, maleic acid, and fumaric acid, and alkyl esters of the unsaturated carboxylic acid, such as methyl, ethyl, propyl, isopropyl, n-butyl, isobutyl, n-hexyl, and octyl esters. As the alkyl group in the ester portion, there can be used an ester of acrylic acid or methacrylic acid having a bridged polycyclic ring hydrocarbon group, such as a bicyclo[2.2.1]heptyl group, a bornyl group, an adamantyl group, a tetracyclo[4.4.0.1$^{2.5}$.1$^{7.10}$]dodecyl group, or a tricyclo[5.2.1.0$^{2.6}$]decyl group. Among these, preferred are acrylic acid, methacrylic acid, and lower alkyl esters thereof, such as methyl, ethyl, propyl, and n-butyl esters, since they are inexpensive and easily available.

In the resin in resin component (a8-2), the molar ratio of at least one type of monomer units selected from an α-(hydroxyalkyl)acrylic acid and an alkyl α-(hydroxyalkyl)acrylate to at least one type of monomer units selected from anther ethylenically unsaturated carboxylic acid and an ethylenically unsaturated carboxylic acid ester is preferably in the range of from 20:80 to 95:5, especially preferably 50:50 to 90:10. When the ratio between the units falls in the above range, an ester is easily formed in the molecule or between the molecules, so that excellent resist patterns can be obtained.

The resin component (a9) is a resin component having at least constitutional units represented by the following general formula (36) or (37):

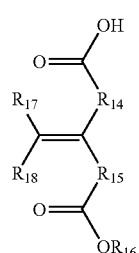

(36)

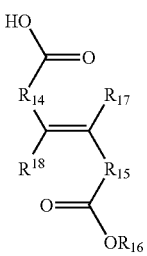

(37)

wherein each of $R_{14}$ and $R_{15}$ represents an alkyl chain having 0 to 8 carbon atoms, $R_{16}$ represents a substituent having at least two or more alicyclic structures, and each of $R_{17}$ and $R_{18}$ represents a hydrogen atom or an alkyl group having 1 to 8 carbon atoms.

The negative resist composition containing a resin component having the dicarboxylic acid monoester monomer units is preferred from the viewpoint of improved resolution and suppressed line edge roughness. In addition, the negative resist composition improves the swelling resistance and is more preferably used in the liquid immersion lithography process.

Examples of the dicarboxylic acid monoester compounds include fumaric acid, itaconic acid, mesaconic acid, glutaconic acid, and traumatic acid.

Preferred examples of resins having the dicarboxylic acid monoester units include polymers or copolymers (a9-1) comprised of dicarboxylic acid monoester monomers, and copolymers (a9-2) comprised of dicarboxylic acid monoester monomers and at least one type of monomers selected from the α-(hydroxyalkyl)acrylic acid, alkyl α-(hydroxyalkyl)acrylate, another ethylenically unsaturated carboxylic acid, and ester of another ethylenically unsaturated carboxylic acid.

The resin components used in the negative resist may be used individually or in combination. The resin component may have a weight average molecular weight of 1,000 to 50,000, preferably 2,000 to 3,0000.

The positive resist that includes the acrylic resin ((a1) to (a4)) among the above resins corresponds to a positive resist containing a resin having a relatively high resistance to water liquid immersion. However, the resolution of a pattern formed from this resist tends to be lowered as the size is closer to the resolution limit in the liquid immersion lithography. The cause of lowering of the resolution is not a single factor, and, for removing such factors, it is considerably effective to form the protective film of the present invention to completely separate the immersion liquid from the resist film.

The positive resist that includes the silsesquioxane resin ((a6) and (a7)) or the negative resist that includes any one of the specific resins (a8) and (a9) or both is considered to have poor liquid immersion resistance, as compared to the positive resist using the acrylic resin, and the suitability of this resist for the liquid immersion lithography can be improved by using the protective film of the present invention.

Further, as seen in the Comparative Examples in the present invention, it is known that the resist that includes a cycloolefin resin has a very poor liquid immersion lithography resistance, which makes it impossible to form a pattern. Even the positive resist containing such a resin can be applied to the liquid immersion lithography by using the protective film of the present invention.

The acid generator used in combination with the resin component of the positive or negative resist may be any acid generators appropriately selected from known acid generators used in a conventional chemically amplified resist.

Specific examples of the acid generators include onium salts, such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate, (4-trifluoromethylphenyl)diphenylsulfonium trifluoromethanesulfonate, (4-trifluoromethylphenyl)diphenylsulfonium nonafluorobutanesulfonate, and tri(p-tert-butylphenyl)sulfonium trifluoromethanesulfonate.

Of the onium salts, triphenylsulfonium salts are preferably used since they are unlikely to decompose to generate organic gas. The amount of the triphenylsulfonium salt incorporated is preferably 50 to 100 mol %, more preferably 70 to 100 mol %, most preferably 100 mol %, based on the total mole of the acid generators.

Among the triphenylsulfonium salts, a triphenylsulfonium salt represented by the general formula (38) below having a perfluoroalkylsulfonic acid ion as anion is especially preferably used since high sensitivity can be achieved:

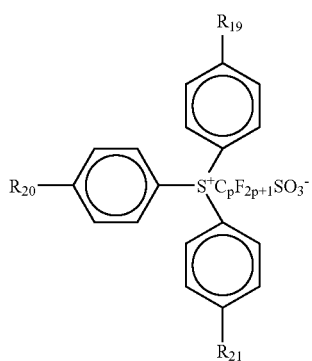 (38)

wherein each of $R_{19}$, $R_{20}$, and $R_{21}$ independently represents a hydrogen atom, a lower alkyl group having 1 to 8, preferably 1 to 4 carbon atoms, or a halogen atom, such as chlorine, fluorine, or bromine; and p is an integer of 1 to 12, preferably 1 to 8, and more preferably 1 to 4.

The acid generators may be used individually or in combination.

The amount of the acid generator incorporated may be 0.5 part by mass, preferably 1 to 10 parts by mass, based on 100 parts by mass of the resin component. When the amount of the acid generator is less than 0.5 part by mass, pattern formation is not satisfactorily achieved, and, when the amount is more than 30 parts by mass, a uniform solution is difficult to obtain, leading to the lowering of the storage stability.

The positive or negative resist composition in the present invention is produced by dissolving the resin component and the acid generator and the arbitrary component mentioned below preferably in an organic solvent.

The organic solvent may be any organic solvents as long as they can dissolve the resin component and the acid generator to form a uniform solution. Any one or more types of solvent appropriately selected from the known solvents for conventional chemically amplified resists can be used.

Examples of the organic solvents include ketones, such as acetone, methyl ethyl ketone, cyclohexanone, methyl isoamyl ketone, and 2-heptanone; polyhydric alcohols and derivatives thereof, such as monomethyl ether, monoethyl ether, monopropyl ether, monobutyl ether, or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers, such as dioxane; and esters, such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used individually or in the form of a mixed solvent composed of two or more of them.

To improve the form and stability with time of the resist pattern, the positive or negative resist may further contain, as a quencher, a known amine, preferably a secondary lower aliphatic amine or a tertiary lower aliphatic amine, or an organic acid, such as an organic carboxylic acid or an oxo-acid of phosphorus.

The lower aliphatic amine means an alkylamine or alkylalcoholamine having 5 carbon atoms or less, and examples of the secondary or tertiary amines include trimethylamine, diethylamine, triethylamine, di-n-propylamine, tri-n-propylamine, tribentylamine, diethanolamine, and triethanolamine, and especially preferred is an alkanolamine, such as triethanolamine. These amines may be used individually or in combination.

The amine is used in an amount in the range of generally from 0.01 to 2.0% by mass, based on the mass of the resin component.

Example of preferred organic carboxylic acids include malonic acid, citric acid, malic acid, succinic acid, benzoic acid, and salicylic acid.

Examples of the oxo-acids of phosphorus and derivatives thereof include phosphoric acid and derivatives thereof, e.g., esters, such as phosphoric acid, di-n-butyl phosphate, and diphenyl phosphate; phosphonic acid and derivatives thereof, e.g., esters, such as phosphonic acid, dimethyl phosphonate, di-n-butyl phosphonate, phenylphosphonic acid, diphenyl phosphonate, and dibenzyl phosphonate; and phosphinic acid, such as phosphinic acid and phenylphosphinic acid, and derivatives thereof, e.g., esters. Of these, especially preferred is phosphonic acid.

The organic acid is used in an amount of 0.01 to 5.0 parts by mass, based on 100 parts by mass of the resin component. The organic acids may be used individually or in combination.

The amount of the organic acid used is preferably in the range of the equimolar amount to the amine or smaller.

The positive resist composition of the present invention may if desired contain an additive miscible with the composition, for example, an additional resin for improving the performance of the resist film, or a surfactant, a dissolution inhibitor, a plasticizer, a stabilizer, a coloring agent, or a halation preventing agent for improving the coating properties.

The negative resist composition of the present invention may if necessary be blended with a cross-linking agent for further increasing the cross-linking density to improve the form or resolution of the resist pattern or the resistance to dry etching.

The cross-linking agent is not particularly limited, and any cross-linking agent appropriately selected from known cross-linking agents for use in a conventional chemically amplified negative resist can be used. Examples of the cross-linking agents include alicyclic hydrocarbons having any one of a hydroxyl group and a hydroxyalkyl group or both and oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxan-2,3-diol, and 1,3,5-trihydroxycyclohexane; and compounds obtained by reacting an amino group-containing compound, such as melamine, acetoguanamine, benzoguanamine, urea, ethyleneurea, or glycoluril, with formaldehyde or formaldehyde and a lower alcohol to replace a hydrogen atom in the amino group by a hydroxymethyl group or a lower alkoxymethyl group. Specific examples thereof include hexamethoxymethylmelamine, bismethoxymethylurea, bismethoxymethylbismethoxyethyleneurea, tetramethoxymethylglycoluril, and tetrabutoxymethylglycoluril, with tetrabutoxymethylglycoluril being especially preferred.

The cross-linking agents may be used individually or in combination.

Next, a method for forming a resist pattern by a liquid immersion lithography process using the protective film of the present invention is described.

A conventional resist composition is first applied onto a substrate, such as a silicon wafer, by means of, e.g., a spinner, and then subjected to prebake (PAB treatment).

An organic or inorganic antireflection coating film can be formed between the substrate and the coating layer of the resist composition to form a two-layer laminate.

The above steps can be conducted using a conventionally known method. It is preferred that the conditions for procedure are appropriately selected depending on the formulation or properties of the resist composition used.

Subsequently, a protective film-forming material composition, for example, "composition obtained by dissolving a mixed resin comprised of chain perfluoroalkyl polyether and cyclic perfluoroalkyl polyether in perfluorotributylamine" is uniformly applied to the surface of the above-cured resist film (comprised of a single layer or multiple layers), and then cured to form a resist protecting film.

The thus obtained substrate having the resist film covered with the protective film is immersed in a refractive index liquid (liquid having a refractive index larger than the refractive index of air and smaller than the refractive index of the resist film).

The resist film on the substrate immersed in the liquid is selectively exposed through a desired mask pattern. In this instance, the exposure light passes through the refractive index liquid and protective film and reaches the resist film.

In this case, the resist film is completely protected by the protective film from the refractive index liquid, so that the resist film does not undergo a change in properties, such as swelling, due to attack of the refractive index liquid, or a component of the resist film is not dissolved in the refractive index liquid to change the refractive index liquid in optical properties, e.g., refractive index.

The wavelength of light used in the above exposure is not particularly limited, and radiation, such as an ArF excimer laser, a KrF excimer laser, an $F_2$ excimer laser, an EUV (extreme ultraviolet light), a VUV (vacuum ultraviolet light), an electron beam, an X-ray, or a soft X-ray can be used. The wavelength is determined mainly by the characteristic of the resist film.

As mentioned above, in the method for forming a resist pattern of the present invention, the resist film is exposed through a liquid having a refractive index larger than that of air and smaller than that of the resist film used (refractive index liquid), the liquid being present on the resist film. Examples of such refractive index liquid include water and fluorocarbon inert liquids. Specific examples of the fluorocarbon inert liquids include liquids comprised mainly of fluorocarbon compounds, such as $C_3HCl_2F_5$, $C_4F_9OCH_3$, $C_4F_9OC_2H_5$, or $C_5H_3F_7$. Among these, water is preferably used from the viewpoint of the cost, safety, environmental issues, and general purpose properties.

The refractive index of the refractive index liquid used is not particularly limited as long as the refractive index is "larger than the refractive index of air and smaller than the refractive index of the resist composition used".

After completion of the step of the exposure in an immersed state, the substrate is taken out of the refractive index liquid, and the liquid is removed from the substrate, and then the protective film is removed. In the removal of the protective film, a fluorine solvent capable of dissolving the fluororesin can be directly used. From the viewpoint of facilitating the drying after washing, a solvent having a boiling point of about 150° C. or lower is preferably used, and preferred is perfluoro(2-butyltetrahydrofuran) (boiling point: 102° C.) from this point of view.

Subsequently, the resist film exposed is subjected to PEB (post-exposure bake), and then developed using an alkaline developer solution comprised of an alkaline aqueous solution. The PEB may be conducted before the step of removing the protective film. Post-bake may be conducted after the development treatment. Preferably, rinsing is carried out using pure water. The rinsing with water is made by, for example, allowing water to fall dropwise or spraying water against the surface of the substrate while rotating the substrate to wash away the developer solution on the substrate and the resist composition dissolved by the developer solution. Then, drying is conducted to obtain a resist pattern having a form patterned in the resist film according to the mask pattern.

By forming a resist pattern by the above method, a resist pattern having a fine line width, especially a line and space pattern having a small pitch with excellent resolution can be produced. The pitch in the line and space pattern means the total distance of a resist pattern width and a space width in the direction of the line width of the pattern.

EXAMPLES

While Examples of the present invention will be explained below, these examples merely exemplify the invention preferably, and do not limit the invention. In the following explanations, Comparative Examples are described along with the Examples.

Example 1

The resin component, acid generator, and nitrogen-containing organic compound shown below were uniformly dissolved in an organic solvent to prepare positive resist composition 1.

As the resin component, 100 parts by mass of a methacrylate-acrylate copolymer comprising three types of constitutional units represented by the chemical formulae (39a), (39b), and (39c) below was used. In the constitutional units used in the preparation of the resin component, p, q, and r are as follows: p=50 mol %, q=30 mol %, and r=20 mol %. The resin component prepared had a mass average molecular weight of 10,000.

(39a)

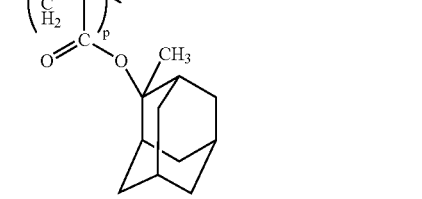

(39b)

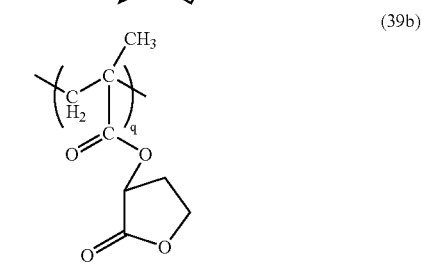

-continued

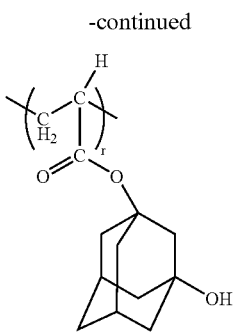

(39c)

As the acid generator, 3.5 parts by mass of triphenylsulfonium nonafluorobutanesulfonate and 1.0 part by mass of (4-methylphenyl)diphenylsulfonium trifluoromethanesulfonate were used.

As the organic solvent, 1,900 parts by mass of a mixed solvent of propylene glycol monomethyl ether acetate and ethyl lactate (mass ratio: 6:4) was used.

Further, as the nitrogen-containing organic compound, 0.3 part by mass of triethanolamine was used.

Using the above-prepared positive resist composition 1, a resist pattern was formed.

An organic antireflection coating composition "AR-19" (trade name; manufactured by Shipley Limited) was first applied onto a silicon wafer using a spinner, and dried by calcination on a hot plate at 215° C. for 60 seconds to form an organic antireflection coating film having a thickness of 82 nm. Then, positive resist composition 1 was applied onto the antireflection coating film using a spinner, and dried by prebake on a hot plate at 115° C. for 90 seconds to form a resist film having a thickness of 150 nm on the antireflection coating film.

A protective film material, which was obtained by dissolving a mixed resin comprised of DEMNUM S-20 (manufactured by DAIKIN INDUSTRIES, Ltd.) and CYTOP (manufactured by ASAHI GLASS CO., LTD.) (weight ratio=1:5) in perfluorotributylamine to have a resin concentration of 2.5 wt %, was applied onto the resist film by spin coating, and heated at 90° C. for 60 seconds to form a protective film having a thickness of 37 nm.

Subsequently, the resist film was irradiated (exposed) through a mask pattern with pattern light using an ArF excimer laser (wavelength: 193 nm) by means of an exposure system NSR-S302B (manufactured by Nikon Corporation, NA (numerical aperture)=0.60, σ=0.75). Then, in a liquid immersion lithography, while rotating the silicon wafer having the resist film exposed, pure water at 23° C. was allowed to fall dropwise against the resist film for 5 minutes. This step corresponds to the step in the practical production process in which the resist film completely immersed in the liquid is exposed. However, the step has a simplified construction such that pure water as a refractive index liquid (immersion liquid) is applied to the resist film after the exposure in order to achieve an evaluation of only the effect of the immersion liquid on the resist film which is previously exposed. This is because based on the above-stated analysis on the liquid immersion lithography method, completion of the exposure in the optics is theoretically guaranteed.

After the step of allowing pure water to fall dropwise, the resultant resist film was subjected to PEB treatment under conditions at 115° C. for 90 seconds, and then the protective film was removed using perfluoro(2-butyltetrahydrofuran). Then, the resist film was developed using an alkaline developer solution at 23° C. for 60 seconds. As the alkaline developer solution, a 2.38% by mass aqueous solution of tetramethylammonium hydroxide was used.

The thus obtained resist pattern having a 130 nm line and space of 1:1 was examined under a scanning electron microscope (SEM). As a result, the pattern profile was found to be excellent such that no fluctuation was observed.

Example 2

An antireflection coating film, an ArF positive resist, and a protective film were formed on a substrate in accordance with the same procedure as that in Example 1.

Using laboratory equipment prepared by Nikon Corporation using a prism and a liquid and two-beam interferometry exposure at a wavelength of 193 nm, the substrate having the protective film formed thereon was subjected to immersion lithography (the bottom surface of the prism was in contact with the protective film through water).

The resultant substrate was subjected to PEB treatment in the same manner as that in Example 1, and the protective film was removed using perfluoro(2-butyltetrahydrofuran). Then, the resist film was developed under the same conditions as those used in Example 1.

The thus obtained resist pattern having a 65 nm line and space of 1:1 was examined under a scanning electron microscope (SEM). As a result, the pattern profile was found to be excellent such that no fluctuation was observed. Further, the pattern obtained was examined for a cross-sectional form under a focused ion beam SEM (Altura 835; manufactured by FEI). As a result, it was found that the cross-sectional form had excellent squareness.

Comparative Example 1

A resist pattern was formed in accordance with substantially the same procedure as that in Example 2 except that no protective film was formed.

As a result, although no change in the sensitivity was found, slight fluctuation (partial narrowing of lines) was observed in the pattern profile. Further, the pattern obtained was examined for a cross-sectional form under a focused ion beam SEM (Altura 835; manufactured by FEI). As a result, a slight T-top form was observed.

Comparative Example 2

The resin component, acid generator, and nitrogen-containing organic compound shown below were uniformly dissolved in an organic solvent to prepare positive resist composition 2.

As the resin component, 100 parts by mass of a polymer comprising constitutional units represented by the chemical formula (40) below was used. The resin component prepared had a mass average molecular weight of 10,000.

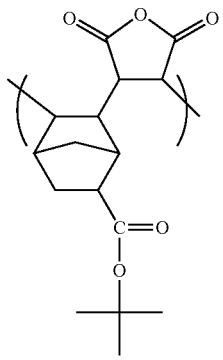

(40)

As the acid generator, 3.5 parts by mass of triphenylsulfonium nonafluorobutanesulfonate and 1.0 part by mass of (4-methylphenyl)diphenylsulfonium trifluoromethanesulfonate were used.

As the organic solvent, 1,900 parts by mass of a mixed solvent of propylene glycol monomethyl ether acetate and ethyl lactate (mass ratio: 6:4) was used.

Further, as the nitrogen-containing organic compound, 0.3 part by mass of triethanolamine was used.

Using the above-prepared positive resist composition 2, a resist pattern was formed.

An organic antireflection coating composition "AR-19" (trade name; manufactured by Shipley Limited) was first applied onto a silicon wafer using a spinner, and dried by calcination on a hot plate at 215° C. for 60 seconds to form an organic antireflection coating film having a thickness of 82 nm. Then, positive resist composition 1 was applied onto the antireflection coating film using a spinner, and dried by prebake on a hot plate at 115° C. for 90 seconds to form a resist film having a thickness of 150 nm on the antireflection coating film.

Subsequently, the resist film was irradiated (exposed) through a mask pattern with pattern light using an ArF excimer laser (wavelength: 193 nm) by means of an exposure system NSR-S302B (manufactured by Nikon Corporation, NA (numerical aperture)=0.60, σ=0.75). Then, in a liquid immersion lithography, while rotating the silicon wafer having the resist film exposed, pure water at 23° C. was allowed to fall dropwise against the resist film for 5 minutes. This step corresponds to the step in the practical production process in which the resist film completely immersed in the liquid is exposed. However, the step has a simplified construction such that pure water as a refractive index liquid (immersion liquid) is applied to the resist film after the exposure in order to achieve an evaluation of only the effect of the immersion liquid on the resist film which is previously exposed. This is because based on the above-stated analysis on the liquid immersion lithography method, completion of the exposure in the optics is theoretically guaranteed.

Subsequently, the resultant resist film was subjected to PEB treatment under conditions at 115° C. for 90 seconds, and developed using an alkaline developer solution at 23° C. for 60 seconds. As the alkaline developer solution, a 2.38% by mass aqueous solution of tetramethylammonium hydroxide was used.

The thus obtained resist pattern having a 130 nm line and space of 1:1 was examined under a scanning electron microscope (SEM), and a sensitivity (Eth) was determined. As a result, it was found that the sensitivity measured was 9.1 mJ/cm$^2$ and the lowering of the sensitivity was considerable as seen from the comparisons made below.

Separately, using resist composition 2 in the present Comparative Example 2, a resist pattern was formed by exposure through a layer of air by the method conventionally used without employing the liquid immersion lithography treatment. As a result, the sensitivity was found to be 8.4 mJ/cm$^2$. A ratio of the sensitivity in the liquid immersion lithography treatment to the sensitivity in the normal exposure (9.1/8.4) was determined to be 108.3.

Comparative Example 3

The resin component, acid generator, and nitrogen-containing organic compound shown below were uniformly dissolved in an organic solvent to prepare positive resist composition 3.

As the resin component, 100 parts by mass of a copolymer comprising constitutional units comprising 63 mol % of hydroxystyrene units, 24 mol % of styrene units, and 13 mol % of tert-butyl acrylate units was used. The resin component prepared had a mass average molecular weight of 12,000.

As the acid generator, 2.8 parts by mass of bis(tert-butylphenyliodonium trifluoromethanesulfonate and 1.0 part by mass of dimethylmonophenylsulfonium trifluoromethanesulfonate were used.

As the organic solvent, 600 parts by mass of ethyl lactate was used.

As the nitrogen-containing organic compound, 0.26 part by mass of triethanolamine was used, and 0.28 part by mass of phenylphosphonic acid was used as another component. Using the above-prepared positive resist composition 3, a resist pattern was formed.

An organic antireflection coating composition "AR-3" (trade name; manufactured by Shipley Limited) was first applied onto a silicon wafer using a spinner, and dried by calcination on a hot plate at 220° C. for 60 seconds to form an organic antireflection coating film having a thickness of 62 nm. Then, positive resist composition 3 was applied onto the antireflection coating film using a spinner, and dried by prebake on a hot plate at 110° C. for 90 seconds to form a resist film having a thickness of 280 nm on the antireflection coating film.

Subsequently, the resist film was irradiated (exposed) through a mask pattern with pattern light using a KrF excimer laser (wavelength: 248 nm) by means of an exposure system NSR-S203 (manufactured by Nikon Corporation, NA (numerical aperture)=0.60, σ=0.75). Then, in a liquid immersion lithography, while rotating the silicon wafer having the resist film exposed, pure water at 23° C. was allowed to fall dropwise against the resist film for 5 minutes. This step corresponds to the step in the practical production process in which the resist film completely immersed in the liquid is exposed. However, the step has a simplified construction such that pure water as a refractive index liquid (immersion liquid) is applied to the resist film after the exposure in order to achieve an evaluation of only the effect of the immersion liquid on the resist film which is previously exposed. This is because based on the above-stated analysis on the liquid immersion lithography method, completion of the exposure in the optics is theoretically guaranteed.

Subsequently, the resultant resist film was subjected to PEB treatment under conditions at 115° C. for 90 seconds, and developed using an alkaline developer solution at 23° C. for 60 seconds. As the alkaline developer solution, a 2.38% by mass aqueous solution of tetramethylammonium hydroxide was used.

Thus obtained resist pattern having a 140 nm line and space of 1:1 was examined under a scanning electron microscope (SEM), and sensitivity (Eth) at that time was determined. As a result, it was found that the sensitivity was 22.0 mJ/cm$^2$. The resist pattern had a T-top form and surface roughening was observed.

Separately, using resist composition 3 in the present Comparative Example, a resist pattern was formed by exposure through a layer of air by the method conventionally used without employing the liquid immersion lithography treatment, and the sensitivity was found to be 20.0 mJ/cm$^2$. A ratio of the sensitivity in the liquid immersion lithography treatment to the sensitivity in the normal exposure (22.0/20.0) was determined to be 108.8. The resist pattern was excellent such that no surface roughening was observed.

Comparative Example 4

The resin component, acid generator, and nitrogen-containing organic compound shown below were uniformly dissolved in an organic solvent to prepare positive resist composition 4.

As the resin component, a mixed resin of 70 parts by mass of a copolymer comprising constitutional units comprising 64 mol % of hydroxystyrene units and 36 mol % of 1-ethoxy-1-ethyloxystyrene units and 30 parts by mass of a copolymer comprising constitutional units comprising 67 mol % of hydroxystyrene units and 33 mol % of tetrahydropyranyloxystyrene units was used. The resin components prepared independently had a mass average molecular weight of 8,000.

As the acid generator, 4 parts by mass of bis(cyclohexylsulfonyl)diazomethane and 1 part by mass of tert-butylphenyliodonium trifluoromethanesulfonate were used.

As the organic solvent, 600 parts by mass of a mixed solvent of propylene glycol monomethyl ether acetate and ethyl lactate (mass ratio: 6:4) was used.

As the nitrogen-containing organic compound, 0.52 part by mass of triisopropanolamine was used, and 0.54 part by mass of dodecanoic acid was used as another component.

Using the above-prepared positive resist composition 4, a resist pattern was formed.

An organic antireflection coating composition "DUV-44" (trade name; manufactured by Brewer Science) was first applied onto a silicon wafer using a spinner, and dried by calcination on a hot plate at 225° C. for 90 seconds to form an organic antireflection coating film having a thickness of 65 nm. Then, positive resist composition 4 was applied onto the antireflection coating film using a spinner, and dried by prebake on a hot plate at 90° C. for 90 seconds to form a resist film having a thickness of 280 nm on the antireflection coating film.

Subsequently, the resist film was irradiated (exposed) through a mask pattern with pattern light using a KrF excimer laser (wavelength: 248 nm) by means of an exposure system NSR-S203 (manufactured by Nikon Corporation, NA (numerical aperture)=0.60, (=0.75). Then, in a liquid immersion lithography, while rotating the silicon wafer having the resist film exposed, pure water at 23° C. was allowed to fall dropwise against the resist film for 5 minutes. This step corresponds to the step in the practical production process in which the resist film completely immersed in the liquid is exposed. However, the step has a simplified construction such that pure water as a refractive index liquid (immersion liquid) is applied to the resist film after the exposure in order to achieve an evaluation of only the effect of the immersion liquid on the resist film which is previously exposed. This is because based on the above-stated analysis on the liquid immersion lithography method, completion of the exposure in the optics is theoretically guaranteed.

Next, the resultant resist film was subjected to PEB treatment under conditions at 110° C. for 90 seconds, and developed using an alkaline developer solution at 23° C. for 60 seconds. As the alkaline developer solution, a 2.38% by mass aqueous solution of tetramethylammonium hydroxide was used.

The thus obtained resist pattern having a 140 nm line and space of 1:1 was examined under a scanning electron microscope (SEM), and sensitivity (Eth) at that time was determined. As a result, it was found that the sensitivity was 26.5 mJ/cm$^2$. The resist pattern had a T-top form and surface roughening was observed.

Separately, using resist composition 4 in the present Comparative Example, a resist pattern was formed by exposure through a layer of air by the method conventionally used without employing the liquid immersion lithography treatment, and the sensitivity was found to be 16.5 mJ/cm$^2$. A ratio of the sensitivity in the liquid immersion lithography treatment to the sensitivity in the normal exposure (26.5/16.5) was determined to be 156.6. The resist pattern was excellent such that no surface roughening was observed.

Examples 1 and 2 indicate that, in the liquid immersion lithography in which a protective film is formed, a pattern of 130 nm line and space having excellent profile can be obtained without lowering the properties required for pattern formation, e.g., sensitivity. In addition, it is apparent that the resist film used in the Examples, which is a positive resist film, can be applied to a negative resist film.

Example 3

The resin component, acid generator, and nitrogen-containing organic compound shown below were uniformly dissolved in an organic solvent to prepare a positive resist.

As the resin component, 100 parts by mass of a polymer comprising constitutional units indicated by the above formula (40). The resin component prepared had a mass average molecular weight of 10,000.

As the acid generator, 3.5 parts by mass of triphenylsulfonium nonafluorobutanesulfonate and 1.0 part by mass of (4-methylphenyl)diphenylsulfonium trifluoromethanesulfonate were used.

As the organic solvent, 1,900 parts by mass of a mixed solvent of propylene glycol monomethyl ether acetate and ethyl lactate (mass ratio: 6:4) was used.

As the nitrogen-containing organic compound, 0.3 part by mass of triethanolamine was used.

An antireflection coating film, an ArF positive resist, and a protective film were formed on a substrate in accordance with substantially the same procedure as in Example 1 except that the above-prepared positive resist composition was used (the thickness of the resist film was changed to 140 nm).

The substrate having the protective film formed thereon was subjected to immersion lithography in the same manner as in Example 2.

The protective film was removed from the resist film under the same conditions as those used in Example 1, and the resist film was subjected to PEB treatment, followed by development.

The thus obtained resist pattern having a 90 nm line and space of 1:1 was examined under a scanning electron microscope (SEM), and, as a result, the pattern profile was found to be excellent such that no fluctuation (pattern narrowing) was observed.

Comparative Example 5

A resist pattern having a 90 nm line and space of 1:1 was formed in accordance with entirely the same procedure as in Example 3 except that the positive photoresist shown in Example 3 was used and that no protective film was formed, and it was examined under a scanning electron microscope (SEM), but the fluctuation and swelling of the pattern were too large to observe the pattern.

Example 4

The resin component, acid generator, and nitrogen-containing organic compound shown below were uniformly dissolved in an organic solvent to prepare a positive resist composition.

As the resin component, a polymer comprising constitutional units represented by the general formulae (41) and (42) below (85 parts by mass of the units of formula (41) and 15 parts by mass of the units of formula (42)) was used. The resin component had a mass average molecular weight of 10,000.

As the acid generator, 3.0 parts by mass of triphenylsulfonium nonafluorobutanesulfonate was used.

As the organic solvent, 1,900 parts by mass of a mixed solvent of propylene glycol monomethyl ether acetate and ethyl lactate (mass ratio: 6:4) was used.

As the nitrogen-containing organic compound, 0.25 part by mass of triethanolamine was used.

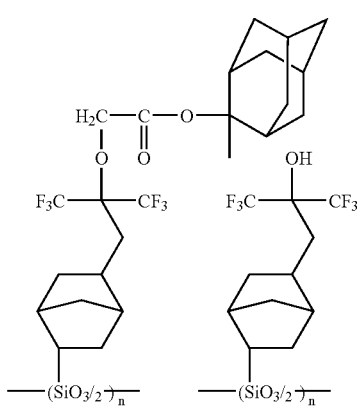

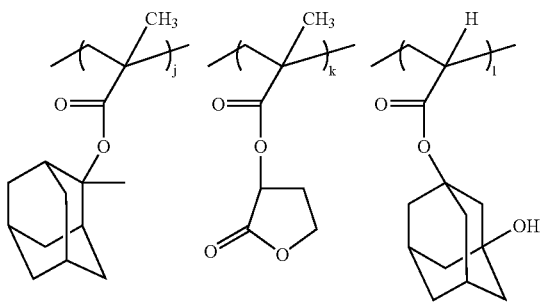

wherein, in formula (42), j=50 mol %, k=30 mol %, and l=20 mol %.

An antireflection coating film, an ArF positive resist, and a protective film were formed on a substrate in accordance with the same procedure as in Example 1 except that the above-prepared positive resist composition was used (the thickness of the resist film was changed to 140 nm).

The substrate having the protective film formed thereon was subjected to immersion lithography in the same manner as in Example 2.

The protective film was removed from the resist film under the same conditions as those used in Example 1, and the resist film was subjected to PEB treatment, followed by development.

The thus obtained resist pattern having a 90 nm line and space of 1:1 was examined under a scanning electron microscope (SEM), and, as a result, the pattern profile was found to be excellent such that no fluctuation (pattern narrowing) was observed.

Comparative Example 6

A resist pattern having a 90 nm line and space of 1:1 was formed in accordance with entirely the same procedure as in Example 4 except that the positive photoresist shown in Example 3 was used and that no protective film was formed, and it was examined under a scanning electron microscope (SEM), but the fluctuation and swelling of the pattern occurred slightly.

Example 5

The resin component, acid generator, and nitrogen-containing organic compound shown below were uniformly dissolved in an organic solvent to prepare a negative resist composition.

As the resin component, a polymer comprising constitutional units represented by the general formula (43) was used.

Based on the mass of the resin component, 10% by mass of a cross-linking agent comprised of tetrabutoxymethylated glycoluril, 1% by mass of an acid generator comprised of triphenylsulfonium nonafluorobutanesulfonate, and 0.6% by mass of an amine component comprised of 4-phenylpyridine were dissolved in propylene glycol monomethyl ether, and the resultant negative resist material having a solids content of 8.1% by mass was used.

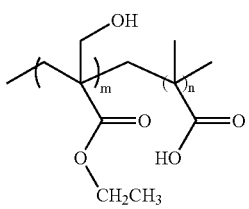

(43)

wherein m:n is 84:16 (mol %).

Using the above-prepared negative resist composition, a resist pattern was formed.

An organic antireflection coating composition "AR-19" (trade name; manufactured by Shipley Limited) was first applied onto a silicon wafer using a spinner, and dried by calcination on a hot plate at 215° C. for 60 seconds to form an organic antireflection coating film having a thickness of 32 nm. Then, the negative resist composition was applied onto the antireflection coating film using a spinner, and dried by prebake on a hot plate at 110° C. for 60 seconds to form a resist film having a thickness of 300 nm on the antireflection coating film.

A protective film material, which was obtained by dissolving a mixed resin comprised of DEMNUM S-10 (manufactured by DAIKIN INDUSTRIES, Ltd.) and CYTOP (manufactured by ASAHI GLASS CO., LTD.) (weight ratio=1:5) in perfluorotributylamine to have the resin concentration 2.5 wt %, was applied onto the resist film by spin coating, and heated at 90° C. for 60 seconds to form a protective film having a thickness of 37 nm.

The substrate having the protective film formed thereon was subjected to exposure in the same manner as in Example 1, and then water was allowed to fall dropwise against the resist film (the treatment of allowing water to fall dropwise was continued for 2 minutes).

The protective film was removed from the resist film under the same conditions as those used in Example 1, and the resist film was subjected to PEB treatment, followed by development.

The thus obtained resist pattern having a 160 nm line and space of 1:1 was examined under a scanning electron microscope (SEM), and, as a result, the pattern profile was found to be excellent such that no fluctuation (pattern narrowing) and swelling were observed at all.

Comparative Example 7

A resist pattern having a 160 nm line and space of 1:1 was formed in accordance with entirely the same procedure as in Example 4 except that the negative photoresist shown in Example 5 was used and that no protective film was formed, and it was examined under a scanning electron microscope (SEM), but the fluctuation and swelling of the pattern occurred slightly.

In the descriptions in the present invention, the following wording and different terms: "liquid having a refractive index larger than that of air and smaller than that of the resist film"; liquid refractive index medium; refractive index liquid; and immersion liquid, which were used for convenience of explanation, designate the same medium.

Example 6

The resin component, acid generator, and nitrogen-containing organic compound shown below were uniformly dissolved in an organic solvent to prepare a positive resist composition.

As the resin component, 100 parts by mass of a methacrylate copolymer comprising three types of constitutional units represented by the general formula (44) below was used. In the constitutional units used in the preparation of the resin component, s, t, and u are as follows: s=40 mol %, t=40 mol %, and u=20 mol %. The resin component prepared had a mass average molecular weight of 10,000.

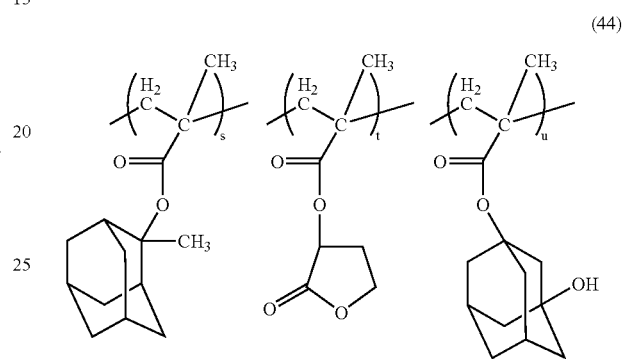

(44)

As the acid generator, 0.8 part by mass of tri-(4-tert-butylphenyl)sulfonium trifluoromethanesulfonate and 2.0 parts by mass of (4-methylphenyl)diphenylsulfonium nonafluorobutanesulfonate were used.

As the organic solvent, a mixed solvent of 1,520 parts by mass of a mixed solvent of propylene glycol monomethyl ether acetate and ethyl lactate (mass ratio: 6:4) and 380 parts by mass of γ-butyrolactone was used.

As the nitrogen-containing organic compound, 0.25 part by mass of triethanolamine was used.

Using the above-prepared positive resist composition, a resist pattern was formed.

An organic antireflection coating composition "AR-19" (trade name; manufactured by Shipley Limited) was first applied onto a silicon wafer using a spinner, and dried by calcination on a hot plate at 215° C. for 60 seconds to form an organic antireflection coating film having a thickness of 82 nm. Then, the positive resist composition was applied onto the antireflection coating film using a spinner, and dried by prebake on a hot plate at 130° C. for 90 seconds to form a resist film having a thickness of 200 nm on the antireflection coating film.

A protective film material, which was obtained by dissolving a mixed resin comprised of DEMNUM S-20 (manufactured by DAIKIN INDUSTRIES, Ltd.) and CYTOP (manufactured by ASAHI GLASS CO., LTD.) (weight ratio=1:5) in perfluorotributylamine to have the resin concentration 2.5 wt %, was applied onto the resist film by spin coating, and heated at 90° C. for 60 seconds to form a protective film having a thickness of 37 nm.

Subsequently, the resist film was irradiated (exposed) through a mask pattern with pattern light using an ArF excimer laser (wavelength: 193 nm) by means of an exposure system NSR-S302B (manufactured by Nikon Corporation, NA (numerical aperture)=0.60, ⅔ annular illumination). Then, in a liquid immersion lithography, while rotating the silicon wafer having the resist film exposed, pure water at 23° C. was allowed to fall dropwise against the resist film for 2 minutes. This step corresponds to the step in the practical production process in which the resist film completely immersed in the liquid is exposed. However, the step has a simplified construction such that pure water as a refractive index liquid (immersion liquid) is applied to the resist film after the exposure in order to achieve an evaluation of only the effect of the immersion liquid on the resist film which is previously exposed. This is because based on the above-stated analysis on the liquid immersion lithography method, completion of the exposure in the optics is theoretically guaranteed.

After the step of allowing pure water to fall dropwise, the resultant resist film was subjected to PEB treatment under conditions at 130° C. for 90 seconds, and then the protective film was removed using perfluoro(2-butyltetrahydrofuran). Then, the resist film was developed using an alkaline developer solution at 23° C. for 60 seconds. As the alkaline developer solution, a 2.38% by mass aqueous solution of tetramethylammonium hydroxide was used.

Thus obtained resist pattern having a 130 nm line and space of 1:1 was examined under a scanning electron microscope (SEM), and, as a result, the pattern profile was found to be excellent such that no fluctuation was observed at all.

The sensitivity was 17.0 mJ/cm$^2$, and the depth of focus was 1.0 μm. An exposure margin in which a 130 nm line pattern was obtained within ±10% was as excellent as 13.15%.

Example 7

The resin component, acid generator, and nitrogen-containing organic compound shown below were uniformly dissolved in an organic solvent to prepare a positive resist composition.

As the resin component, a polymer comprising constitutional units represented by the general formulae (41) and (45) below (85 parts by mass of the units of formula (41) and 15 parts by mass of the units of formula (45)) was used. The resin component had a mass average molecular weight of 10,000.

As the acid generator, 2.4 parts by mass of triphenylsulfonium nonafluorobutanesulfonate was used.

As the organic solvent, 1,900 parts by mass of a mixed solvent of propylene glycol monomethyl ether acetate and ethyl lactate (mass ratio: 6:4) was used.

As the nitrogen-containing organic compound, 0.27 part by mass of triethanolamine was used. As the organic carboxylic acid, 0.26 part by mass of salicylic acid was used.

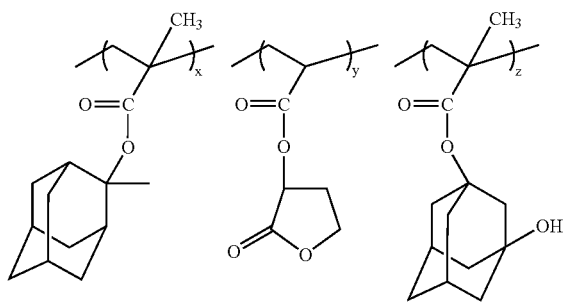

(45)

wherein x=40 mol %, y=40 mol %, and z=20 mol %.

An antireflection coating film, a positive resist using the resist composition, and a protective film were formed on a substrate in accordance with substantially the same procedure as in Example 1 (except that the thickness of the resist film was changed to 150 nm, that the prebake conditions were changed to those at 95° C. for 90 seconds, and that the PEB conditions were changed to those at 90° C. for 90 seconds)

The substrate having the protective film formed thereon was subjected to immersion lithography in the same manner as in Example 2.

The resist film was subjected to PEB treatment, and then the protective film was removed under the same conditions as those used in Example 1, and allowed to stand in a place having an amine concentration of about 5 ppb in air for 180 seconds, followed by development.

Thus obtained resist pattern having a 130 nm line and space of 1:1 was examined under a scanning electron microscope (SEM), and, as a result, the pattern profile was found to be excellent such that no fluctuation (pattern narrowing) was observed. The sensitivity was 26.0 mJ/cm$^2$.

Comparative Example 8

The resist composition prepared in Example 7 was allowed to stand for 180 seconds in the same manner as in Example 7, and then a resist pattern was formed in substantially the same manner as in Example 7 except that no protective film was used.

The resist pattern having a 130 nm line and space of 1:1 was examined under a scanning electron microscope (SEM), and, as a result, the pattern profile was found to have a T-TOP form. The sensitivity was 33.0 mJ/cm$^2$.

The reason for this resides in that no protective film was used and hence amine contained in air deactivated acid on the resist film.

As can be seen from the results of Example 7 and Comparative Example 8, the use of the protective film can prevent the resist film from being adversely affected by the amine contained in air. That is, the post exposure delay is drastically improved.

Example 8

As component (A), a mixed resin of 85 parts by mass of a silsesquioxane resin of the chemical formula (46) below and 15 parts by mass of a methacrylate-acrylate copolymer comprising three types of constitutional units represented by the chemical formula (47) below was used. In the constitutional units in the copolymer of the chemical formula (47), v, w, and x are as follows: v=40 mol %, w=40 mol %, and x=20 mol %, and the copolymer had a mass average molecular weight of 10,000.

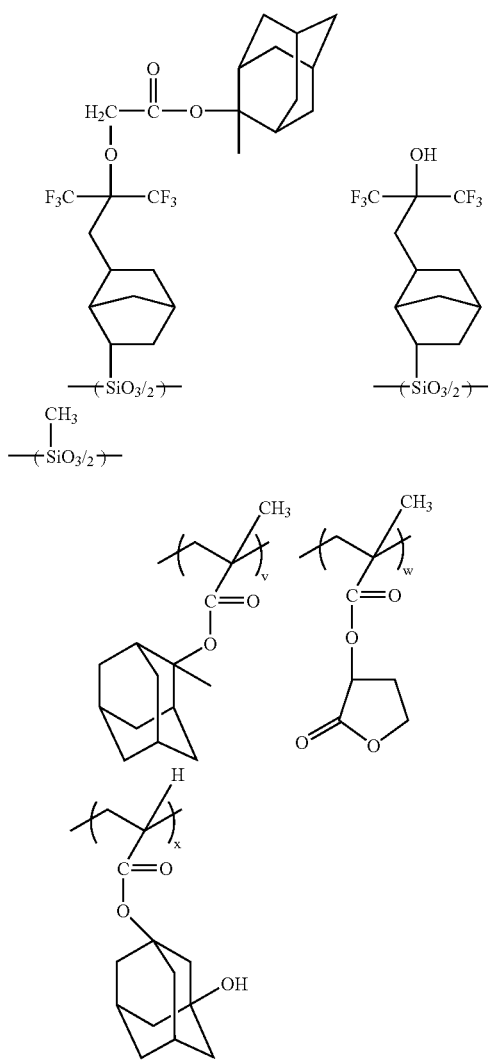

As component (B), 2.4 parts by mass of triphenylsulfonium nonafluorobutanesulfonate was used.

As component (C), 1,900 parts by mass of a mixed solvent of ethyl lactate and γ-butyrolactone (mass ratio: 8:2) was used.

As component (D), 0.27 part by mass of triethanolamine was used.

As component (E), 0.26 part by mass of salicylic acid was used.

Next, an organic antireflection coating composition "AR-19" (trade name; manufactured by Shipley Limited) was applied onto a silicon wafer using a spinner, and dried by calcination on a hot plate at 215° C. for 60 seconds to form an organic antireflection coating film having a thickness of 82 nm. The positive resist composition was applied onto the antireflection coating film using a spinner, and dried by prebake on a hot plate at 95° C. for 90 seconds to form a resist layer having a thickness of 150 nm on the antireflection coating film. Then, the resist film was spin-coated with a fluorine protective film material having a resin concentration of 2.5 wt %, which was prepared by dissolving a mixed resin of DEMNUM S-10 (manufactured by DAIKIN INDUSTRIES, Ltd.) and CYTOP (manufactured by ASAHI GLASS CO., LTD.) (weight ratio=1:5) in perfluorotributy-lamine, and heated at 90° C. for 60 seconds to form a protective film having a thickness of 37 nm.

Then, in the evaluation test 2, using laboratory equipment prepared by Nikon Corporation, the resultant resist film was subjected to immersion lithography by 193-nm two-beam interferometry using a prism and water (two-beam interferometry experiment). A similar method is disclosed in the document 2 (J. Vac. Sci. Technol. B(2001) 19(6), p 2353-2356) above, which is known as a method by which a L&S pattern can be easily obtained in a laboratory scale.

In the immersion lithography in Example 8, a solvent layer of water as an immersion solvent was formed between the top surface of the protective film and the bottom surface of the prism.

The exposure energy was selected so that the L&S pattern was constantly obtained. Subsequently, the resist film was subjected to PEB treatment under conditions at 90° C. for 90 seconds, and the protective film was removed using perfluoro(2-butyltetrahydrofuran). Then, the resist film was developed in the same manner as in Example 1 to obtain a 65 nm line and space (1:1). The pattern form obtained had high squareness.

As described above, in the present invention, even when a resist film is formed using any resist composition commonly used, a resist pattern with high resolution can be obtained by a liquid immersion lithography process wherein the resist pattern is advantageous not only in that the resist pattern does not suffer surface roughening, e.g., T-top form and has high sensitivity and excellent resist pattern profile form, but also in that the resist pattern has excellent depth of focus and excellent exposure margin as well as excellent post exposure delay. Therefore, the use of the protective film according to the present invention makes it possible to effectively form a resist pattern using the liquid immersion lithography process.

REFERENCES

1. Journal of Vacuum Science & Technology B (J. Vac. Sci. Technol. B) (Published in the United States) 1999, Vol. 17, 6th edition, pp. 3306-3309
2. Journal of Vacuum Science & Technology B (J. Vac. Sci. Technol. B) (Published in the United States) 2001, Vol. 19, 6th edition, pp. 2353-2356
3. Proceedings of SPIE Vol. 4691 (Published in the United States) 2002, Vol. 4691, pp. 459-465

The invention claimed is:

1. A method for forming a resist pattern using a liquid immersion lithography process, the method comprising:
    forming a photoresist film on a substrate;
    forming, on the resist film, a protective film having the following properties of: being transparent with respect to exposure light, having substantially no compatibility with a liquid for liquid immersion lithography, and causing no mixing with the resist film;
    directly placing the liquid for liquid immersion lithography having a predetermined thickness at least on the protective film on the substrate having the resist film and the protective film stacked thereon;
    selectively irradiating the resist film with light through the liquid for liquid immersion lithography and the protective film, and optionally subjecting the resultant resist film to heat treatment;
    removing the protective film from the irradiated resist film; and
    developing the resist film from which the protective film is removed to obtain a resist pattern and wherein said protective film is formed using a composition comprising a fluorine substituted polymer dissolved in a fluorocarbon solvent.

2. The method for forming a resist pattern using a liquid immersion lithography process according to claim 1, wherein the liquid immersion lithography process is of a construction in which the resist film is exposed through the liquid for liquid immersion lithography present at least on the resist film in a ray of the lithography exposure light toward the resist film, wherein the liquid has a predetermined thickness and has a refractive index larger than that of air and smaller than that of the resist film, whereby improving the resolution of a resist pattern.

3. The method for forming a resist pattern using a liquid immersion lithography process according to claim 1, wherein the liquid for liquid immersion lithography is water substantially comprised of pure water or deionized water.

4. The method for forming a resist pattern using a liquid immersion lithography process according to claim 1, wherein the resist film is formed from a resist composition comprised of a base polymer which is a polymer comprising (meth)acrylic ester units.

5. The method for forming a resist pattern using a liquid immersion lithography process according to claim 1, wherein the resist film is formed from a resist composition comprised of a base polymer which is a polymer having dicarboxylic acid anhydride-containing constitutional units.

6. The method for forming a resist pattern using a liquid immersion lithography process according to claim 1, wherein the resist film is formed from a resist composition comprised of a base polymer which is a polymer having phenolic hydroxyl group-containing constitutional units.

7. The method for forming a resist pattern using a liquid immersion lithography process according to claim 1, wherein the resist film is formed from a resist composition comprised of a base polymer which is a silsesquioxane resin.

8. The method for forming a resist pattern using a liquid immersion lithography process according to claim 1, wherein the resist film is formed from a resist composition comprised of a base polymer which is a polymer having α-(hydroxyalkyl)acrylic acid units.

9. The method for forming a resist pattern using a liquid immersion lithography process according to claim 1, wherein the resist film is formed from a resist composition comprised of a base polymer which is a polymer having dicarboxylic acid monoester units.

10. The method for forming a resist pattern using a liquid immersion lithography process according to claim 1, wherein the fluorine-substituted polymer is comprised of any one of cyclic perfluoroalkyl polyether and chain perfluoroalkyl polyether or both.

* * * * *